United States Patent [19]
Sugiyama

[11] Patent Number: 5,637,513
[45] Date of Patent: Jun. 10, 1997

[54] FABRICATION METHOD OF SEMICONDUCTOR DEVICE WITH SOI STRUCTURE

[75] Inventor: Mitsuhiro Sugiyama, Tokyo, Japan

[73] Assignee: NEC Corporation, Tokyo, Japan

[21] Appl. No.: 499,493

[22] Filed: Jul. 7, 1995

[30] Foreign Application Priority Data

Jul. 8, 1994 [JP] Japan ................................. 6-180635

[51] Int. Cl.$^6$ ................................. H01L 21/265
[52] U.S. Cl. ................... 438/311; 438/404; 438/403; 438/413
[58] Field of Search ................. 437/21, 67, 62, 437/84, 31; 148/DIG. 150, DIG. 85

[56] References Cited

U.S. PATENT DOCUMENTS

| | | | |
|---|---|---|---|
| 3,877,060 | 4/1975 | Shono et al. | 148/DIG. 150 |
| 5,036,021 | 7/1991 | Goto | 437/67 |
| 5,116,771 | 5/1992 | Karulkar | 437/40 |
| 5,196,373 | 3/1993 | Beasom | 437/62 |
| 5,258,318 | 11/1993 | Buti et al. | 437/62 |
| 5,270,265 | 12/1993 | Hemmenway et al. | 437/67 |
| 5,332,683 | 7/1994 | Miyashhita et al. | 437/67 |
| 5,336,634 | 8/1994 | Katayama et al. | 437/62 |
| 5,482,871 | 1/1996 | Pollack | 437/21 |

FOREIGN PATENT DOCUMENTS

| | | | |
|---|---|---|---|
| 0168233 | 10/1983 | Japan | 437/67 |
| 405109880 | 4/1993 | Japan | 437/67 |
| 6-177235 | 6/1994 | Japan . | |

OTHER PUBLICATIONS

Edward Yang, "Microelectronic Devices", 1988, pp. 67–68.

Nishizawa, H., et al., "Fully SiO$_2$ Isolated High Speed Self–Aligned Bipolar Transistor in Thin SOI", *Symposium on VLSI Technology Digest*, 1991, pp. 51–52.

*Primary Examiner*—John Niebling
*Assistant Examiner*—Long Pham
*Attorney, Agent, or Firm*—Young & Thompson

[57] ABSTRACT

A fabrication method of a semiconductor device that can realize a semiconductor device having an improved radiation performance of heat together with a low parasitic capacitance between a semiconductor substrate and a conductor of the device. An SOI structure having a single-crystal silicon layer formed on an insulating substructure is prepared and then, device regions are formed on the substructure by using the single-crystal silicon layer. Sidewall insulators are formed to cover side faces of the respective device regions, laterally isolating the device regions from each other. A resistive silicon layer is formed on a non-device region of the substructure. The resistive silicon layer has a resistivity or specific resistance greater than that of the device regions. Electronic elements are formed in the device regions. The resistive silicon layer may be made of polysilicon or single-crystal silicon.

19 Claims, 7 Drawing Sheets

FABRICATION METHOD OF SEMICONDUCTOR DEVICE WITH SOI STRUCTURE

BACKGROUND OF THE INVENTION

1. Field of the Invention

The present invention relates to a fabrication method of a semiconductor device and more particularly, to a fabrication method of a semiconductor device with a Silicon On Insulator (SOI) structure that provides better radiation of heat and reduces the parasitic capacitance between a wiring or interconnecting conductor and a semiconductor substrate.

2. Description of the Prior Art

Conventionally, the selective oxidation technique was used for isolation purpose in fabrication of bipolar large-scale integrated circuits (LSIs) formed on a silicon (Si) substrate.

Figure 1:
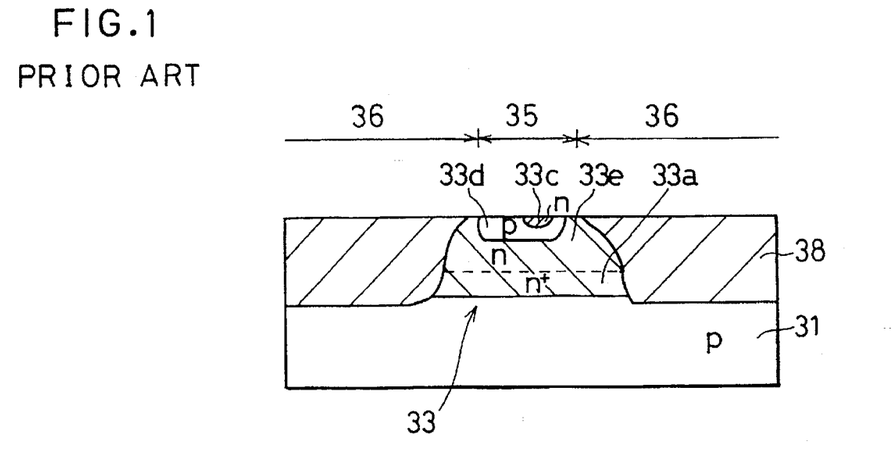
FIG. 1 is a partial cross-sectional view of a semiconductor device fabricated by a first example of the conventional methods.

FIG. 1 shows an npn bipolar transistor fabricated by using the selective oxidation technique, in which only one device region is drawn for the sake of simplification.

In FIG. 1, an n-type single-crystal Si layer 33 formed on a p-type single-crystal Si substrate 31 is partitioned by a silicon dioxide ($SiO_2$) film 38, defining device regions 35 and a remaining non-device region 36 on the substrate 31. The $SiO_2$ film 38 is selectively formed using a mask (not shown) which is typically made of a patterned silicon nitride ($Si_3O_4$) film. The device regions 35 are laterally isolated by the $SiO_2$ film 38 from each other.

The single-crystal Si layer 33 is made of a lower sublayer and an upper sublayer. The lower sublayer forms n+-type buried regions 33a, and the upper sublayer contains n-type collector regions 33e, p-type base regions 33d and n-type emitter regions 33c in the device regions 35.

The conventional selective oxidation technique was not able to satisfactorily cope with the progressing miniaturization of the elements and therefore, the following trench isolation technique was then developed.

Figure 2:
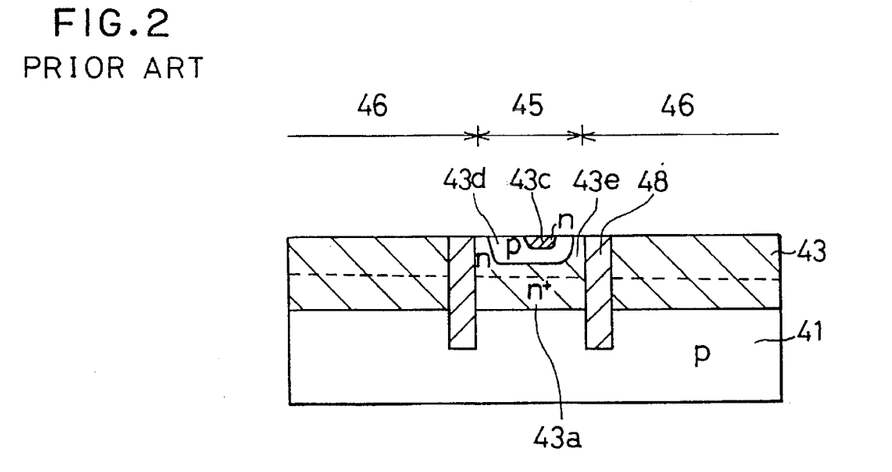
FIG. 2 is a partial cross-sectional view of a semiconductor device fabricated by a second example of the conventional methods.

FIG. 2 shows an npn bipolar transistor fabricated by using the trench isolation technique, in which an n-type single-crystal Si layer 43 formed on a p-type single-crystal Si substrate 41 is partitioned by trenches, defining device regions 45 and a remaining a non-device region 46 on the substrate 41. The trenches surround the corresponding device regions 45, respectively, and extend vertically from the surface of the layer 43 to the inside of the substrate 41. The trenches are filled with an insulator 48 such as $SiO_2$. The device regions 45 are laterally isolated by the insulator 48 from each other.

In the device regions 45, similar to the case of FIG. 1, the single-crystal Si layer 43 is made of a lower sublayer and an upper sublayer. The lower sublayer forms n+-type buried regions 43a, and the upper sublayer contains n+-type collector regions 43e, p-type base regions 43d and n-type emitter regions 43c in the device regions 45.

Figure 3:
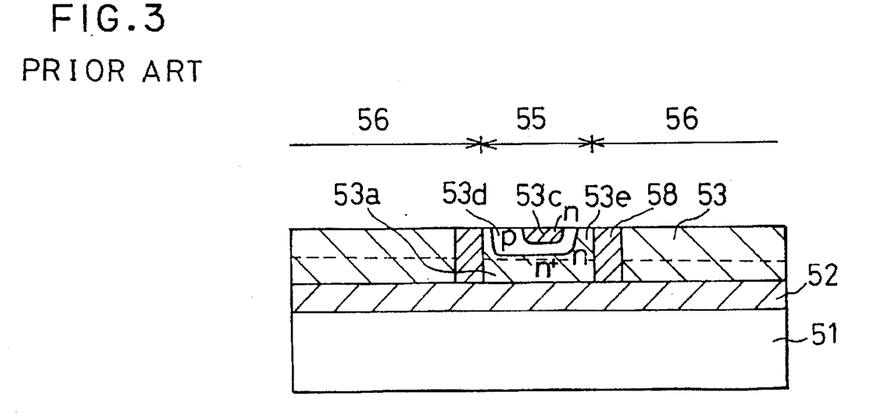
FIG. 3 is a partial cross-sectional view of a semiconductor device fabricated by a third example of the conventional methods.

Recently, high-quality SOI structures have become able to be acquired readily because the Separation by IMplanted OXygen (SIMOX) technique and the wafer bonding technique have been developed. FIG. 3 shows an npn bipolar transistor fabricated by using such a SOI structure.

In FIG. 3, the SOI structure contains an n-type single-crystal Si layer 53, a single-crystal Si substrate 51 and an $SiO_2$ layer 52 placed between the substrate 51 and the layer 53.

The single-crystal Si layer 53 is partitioned by trenches to define device regions 55 and a remaining a non-device region 56 on the $SiO_2$ layer 52. The trenches surround the corresponding device regions 55, respectively, and extend vertically from the surface of the Si layer 53 to the $SiO_2$ layer 52. The trenches are filled with an insulator 58 such as $SiO_2$.

Similar to the cases of FIGS. 1 and 2, the single-crystal Si layer 53 is made of a lower sublayer and an upper sublayer. The lower sublayer forms n+-type buried regions 53a, and the upper sublayer contains n-type collector regions 53e, p-type base regions 53d and n-type emitter regions 53c in the device regions 55.

The device regions 55 are laterally isolated by the insulator 58 and vertically isolated by the underlying $SiO_2$ layer 52 from each other. This means that the complete isolation of the device regions 55 can be realized.

With the conventional bipolar transistor shown in FIG. 3, the device regions 55 are laterally and vertically isolated by the insulators 58 and 52 and therefore, there is an advantage that improved isolation reliability can be obtained compared with the cases of the above selective oxidation and trench isolation techniques.

Another advantage is that the transistor of FIG. 3 is capable of high-speed operation, the reason of which is as follows:

In the transistor of FIG. 1, parasitic capacitances occur between the collector regions 33e and the substrate 31. In the transistor of FIG. 2, parasitic capacitances occur between the collector regions 43e and the substrate 41. On the other hand, in the transistor of FIG. 3, parasitic capacitances between the single-crystal Si layer 53 of the non-device region 56 and the substrate 51 occurs, which changes dependent upon the thickness of the intervening $SiO_2$ layer 52. If the thickness of the layer 52 is about 0.2 μm or more, the parasitic capacitance of the transistor of FIG. 3 becomes lower than the cases of FIGS. 1 and 2, resulting in the higher-speed operation.

In the case of the transistor of FIG. 3, the isolation process is, which is similar to that of the trench isolation of FIG. 2, performed by the popular photolithography and dry etching techniques. The trench formation process is readily realized by utilizing the etching selectivity between Si and $SiO_2$. Also, the $SiO_2$ filling process into the trenches is realized by the same process in the case of the conventional trench isolation of FIG. 2.

Thus, in the case of the SOI structure of FIG. 3, the complete isolation structure can be obtained without substantial change in fabrication process with respect to the conventional trench isolation structure of FIG. 2.

However, the SOI structure of FIG. 3 has a disadvantage of higher parasitic capacitances between the wiring or interconnecting conductors and the substrate 51 than the case of the conventional selective oxidation technique of FIG. 1. The reason for the higher parasitic capacitance is that the non-device region 56 has the single-crystal Si layer 53 that is doped with an impurity to act as a conductor, instead of the insulating $SiO_2$ film 38.

To overcome such the capacitance problem, another structure was developed, in which the selective oxidation technique was additionally performed in the structure of FIG. 3. However, this structure is not practically because a great stress tends to be applied to the substrate 51 due to the $SiO_2$ layer placed in the non-device region 56.

Figure 4:
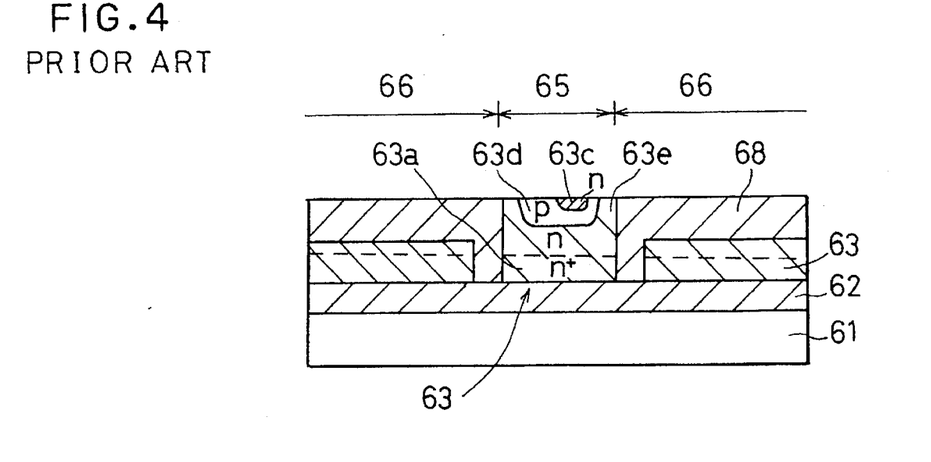
FIG. 4 is a partial cross-sectional view of a semiconductor device fabricated by a fourth example of the conventional methods.

Then, a further structure shown in FIG. 4 was developed, which was disclosed by Nishizawa et al. in "1991 Symposium on VLSI Technology Digest", pp 51–52.

In FIG. 4, the SOI structure contains an n-type single-crystal Si layer 63, a single-crystal Si substrate 61 and an SiO$_2$ layer 62 placed between the substrate 61 and the layer 63.

The single-crystal Si layer 63 is partitioned by deep trenches to define device regions 65 and a remaining a non-device region 66 on the SiO$_2$ layer 62. The trenches surround the corresponding device regions 65, respectively. The trenches are filled with an insulator 68 such as SiO$_2$. The device regions 65 are laterally isolated by the insulator 68 and vertically isolated by the underlying SiO$_2$ layer 62 from each other.

Similar to the cases of FIGS. 1, 2 and 3, the single-crystal Si layer 63 is made of a lower sublayer and an upper sublayer. The lower sublayer forms n+-type buried regions 63a, and the upper sublayer contains n-type collector regions 63e, p-type base regions 63d and n-type emitter regions 63c in the device regions 65.

To reduce the parasitic capacitances, shallow trenches are formed on the single-crystal Si layer 63. Therefore, unlike the SOI structure of FIG. 3, the Si layer 63 in the non-device region 66 is reduced in thickness, and the insulator 68 is placed not only to fill the isolating deep trenches but also the capacitance-reducing shallow trenches on the Si layer 63. Thus, both the satisfactory isolation and parasitic capacitance reduction can be realized.

However, the SOI structure of FIG. 4 has a disadvantages that the parasitic capacitances between the wiring or interconnecting conductors and the substrate 61 are still large due to the single-crystal Si layer 63 placed in the non-device region 66, and that the number of necessary fabrication process steps is large because the deep and shallow trenches are necessary. To overcome these disadvantages, the inventor, M. Sugiyama, has developed the other SOI structure as shown in FIGS. 5, 6 and 7A to 7D, which was disclosed in 1994 in the Japanese Non-Examined Patent Publication No. 6-177235.

Figure 5:
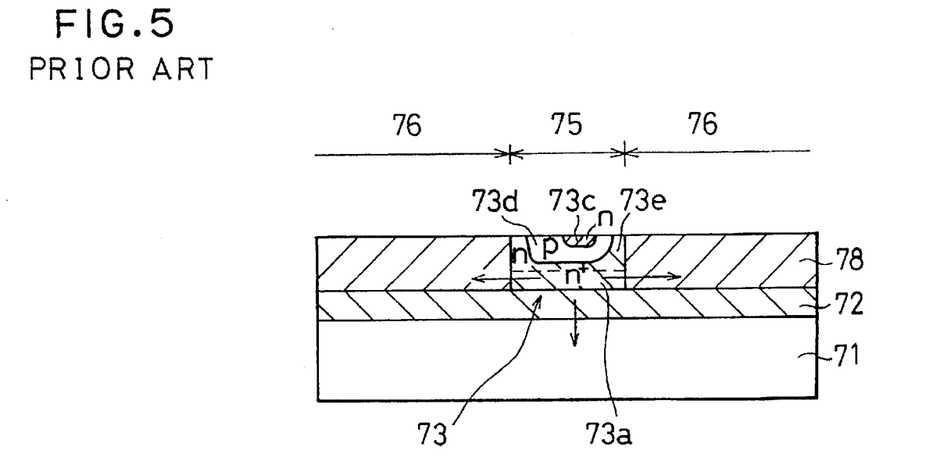
FIG. 5 is a partial cross-sectional view of a semiconductor device fabricated by a fifth example of the conventional methods.

The SOI structure of FIG. 5 contains an n-type single-crystal Si layer 73, a single-crystal Si substrate 71, and an SiO$_2$ layer 72 placed between the substrate 71 and the layer 73.

The single-crystal Si layer 73 is selectively etched to be islands, defining device regions 75 by the islands and a remaining a non-device region 76 on the SiO$_2$ layer 72. The SiO$_2$ layer 72 is exposed in the non-device region 76 from the layer 73 and is covered with an SiO$_2$ film 78.

In the device regions 75, similar to the cases of FIGS. 1, 2, 3 and 4, the single-crystal Si layer 73 is made of a lower sublayer and an upper sublayer. The lower sublayer forms n+-type buried regions 73a, and the upper sublayer contains n-type collector regions 73e, p-type base regions 73d and n-type emitter regions 73c in the device regions 75.

The device regions 75 are laterally isolated by the SiO$_2$ film 78 and vertically isolated by the underlying SiO$_2$ layer 72 from each other.

The conventional SOI structure of FIG. 5 is fabricated by the following process steps:

First, the SOI structure having the substrate 71, the SiO$_2$ layer 72 and the single-crystal Si layer 73 is prepared. The layer 73 has the n+-type lower sublayer 73a and the n-type upper sublayer 73b.

Figure 7A:
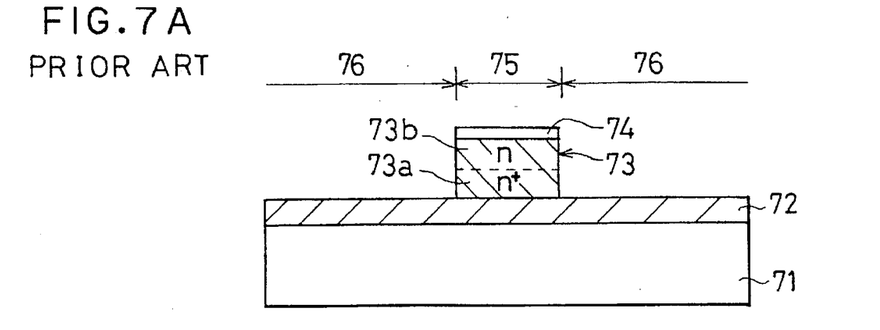
FIGS. 7A to 7D are partial cross-sectional views showing the conventional method of the fifth example, respectively.

Then, after a thin Si$_3$N$_4$ film 74 is formed on the Si layer 73, the Si layer 73 and the Si$_3$N$_4$ film 74 are selectively removed by the popular photolithography and dry etching techniques, defining the device regions 75 and the non-device region 76 on the SiO$_2$ layer 72, as shown in FIG. 7A. The Si$_3$N$_4$ film 74 acts as an etching stop during this etching process.

Figure 7B:
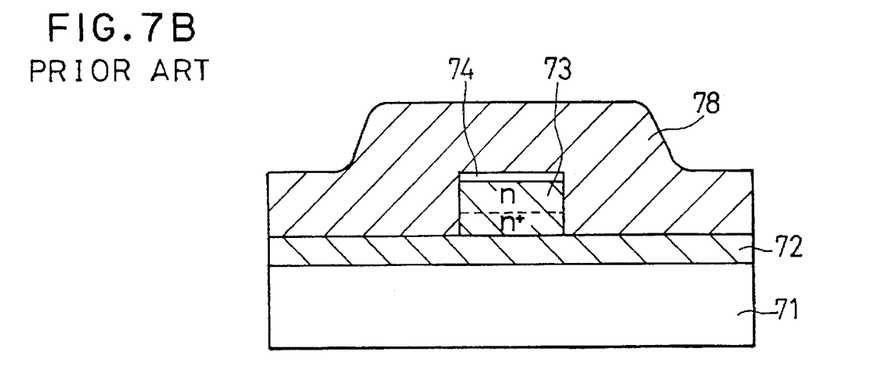
Figure 7C:
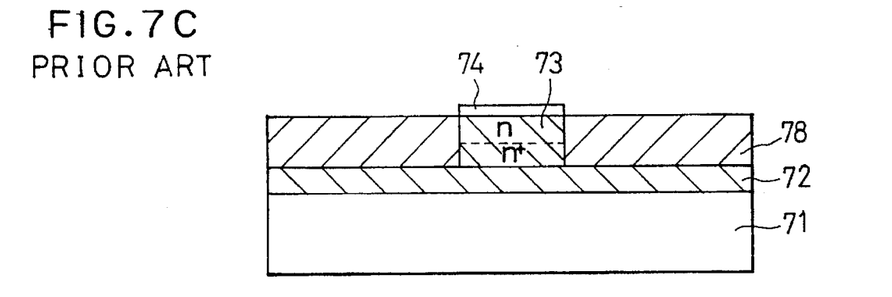
Figure 7D:
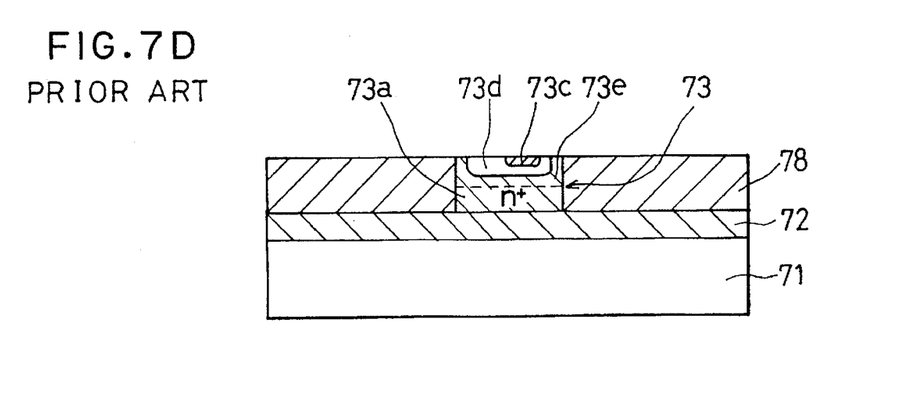

Next, the thick SiO$_2$ film 78 is deposited to cover the device regions 75 and the non-device region 76 over the substrate 71, as shown in FIG. 7B. The SiO$_2$ film 78 is then polished to be flattened until the Si$_3$N$_4$ film 74 is exposed, as shown in FIG. 7C. The film 74 act as a polishing stop in this process.

After removing the Si$_3$N$_4$ film 74, the collector, base and emitter regions 73e, 73d and 73c are formed in the device regions 55 through the popular formation processes, providing the bipolar transistors in the regions 55. Thus, the semiconductor device shown in FIG. 5 is obtained.

The SOI structure of FIG. 5 can reduce the parasitic capacitances between the substrate 71 and the interconnecting conductors to ($\frac{1}{3}$) or ($\frac{1}{5}$) that of the structure of FIG. 3. However, a problem that the heat generated in the device regions 75 and the heat generated in the conductors radiates poorly, the reason of which is as follows:

The heat generated in the device regions 75 propagates to the substrate 71 and the SiO$_2$ film 78 in the non-device region 76 along the arrows shown in FIG. 5. SiO$_2$ has the thermal conductivity equal to about ($\frac{1}{100}$) the thermal conductivity of Si whose value is about 170 W/mK. Therefore, the heat does not propagate efficiently to the substrate 71 through the SiO$_2$ film 78, which prevents the maximum available power consumption from increasing.

Figure 6:
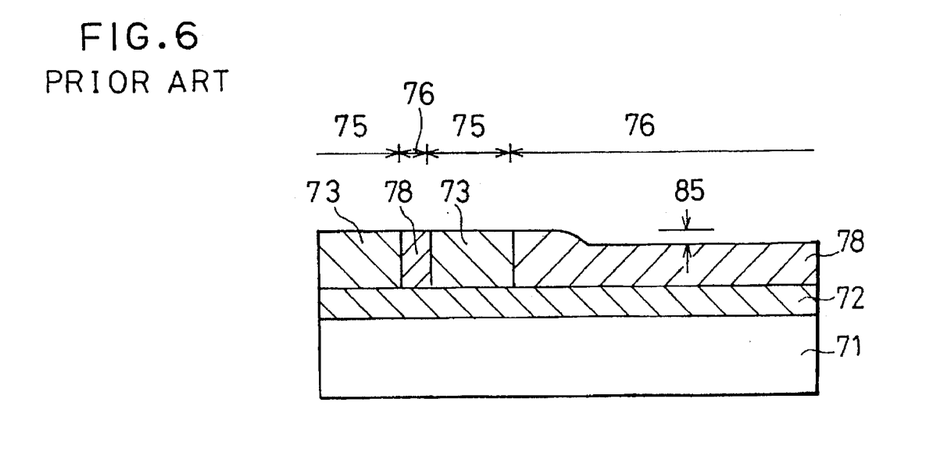
FIG. 6 is a partial cross-sectional view of a semiconductor device of FIG. 5, which shows a depression produced in the non-device region.

The SOI structure of FIG. 5 has another problem that some depressions 85 tend to be formed in the non-device region 76, as shown in FIG. 6, because the SiO$_2$ film 78 is required to be polished excessively in consideration with the polishing rate fluctuation within the entire substrate 71. This problem becomes remarkably effective in the case of the island-like device regions 75 and of the extremely hard SiO$_2$ layer 78, preventing the complete flatness.

SUMMARY OF THE INVENTION

Accordingly, an object of the present invention is to provide a fabrication method of a semiconductor device that can realize a semiconductor device having an improved radiation performance of heat together with a low parasitic capacitance between a semiconductor substrate and a conductor of the device.

Another object of the present invention is to provide a fabrication method of a semiconductor device that can prevent the depressions shown in FIG. 6 during in the polishing process.

A fabrication method of a semiconductor device according to a first aspect of the present invention includes the following steps:

An SOI structure having a single-crystal silicon layer formed on an insulating substructure is prepared and then, device regions are formed on the substructure by using the single-crystal silicon layer. Sidewall insulators are formed to cover side faces of the respective device regions, laterally isolating the device regions from each other. An electrically resistive silicon layer is formed on a non-device region of the substructure. The resistive silicon layer has an electrically resistivity or specific resistance greater than that of the device regions. Electronic elements are formed in the device regions.

With the method according to the first aspect, the resistive silicon layer is formed on the insulating substructure in the non-device region, and the resistive silicon layer has an electrically resistivity or specific resistance greater than that of the device regions.

Since the resistive silicon layer has a greater thermal conductivity than that of an insulator such as $SiO_2$, an improved radiation performance of heat can be obtained.

Also, the resistive silicon layer can be regarded as a dielectric concerning the parasitic capacitance between the substrate and a conductor formed over the non-device region, if the resistive silicon layer has a suitable electrical resistivity for the operating frequency range of the semiconductor device. Therefore, the parasitic capacitance can be kept low.

For example, when the operating frequency, or the applicable electric signal frequency of the semiconductor device is 1 GHz, the electrical resistivity of the resistive silicon layer is preferably 10 $\Omega$.cm or greater.

Since the electrical resistive silicon layer, which is the same material as that of the device regions, is formed in the non-device region, no depression is produced in a polishing process for flattening the tops of the device regions and the non-device region.

The resistive silicon layer may be made of polysilicon or single-crystal silicon having a high resistivity. In the case of polysilicon, the step of forming the sidewall insulators is performed by oxidizing the device regions to produce a silicon dioxide film, and removing selectively the silicon dioxide film at the top faces of the device regions. The step of selectively removing the silicon dioxide film is preferably performed by a polishing process.

In the case or single-crystal silicon, the step of forming the sidewall insulators is performed by forming trenches that surround the respective device regions and filling the trenches with a burying insulator.

A fabrication method of a semiconductor device according to a second aspect of the present invention includes the following steps:

An SOI structure having a single-crystal silicon layer formed on an insulating substructure is prepared and then, the single-crystal silicon layer is selectively removed to form device regions and a non-device region on the insulating substructure. The device regions are made of the remaining single-crystal silicon layer.

After an insulator layer is formed to cover top and side faces of the device regions, a polysilicon layer is formed to cover the insulator layer and the non-device region.

The polysilicon layer and the insulator layer are removed by polishing until the top faces of the device regions are exposed from the insulator layer, producing sidewall insulators by the remaining insulator layer at the side faces of the device regions. The polysilicon layer has an electrically resistivity greater than that of the device regions. Electronic elements are formed in the device regions.

The device regions are laterally isolated from each other by the sidewall insulators and the remaining polysilicon layer is placed on the non-device region.

The insulator layer is preferably made of $SiO_2$. The $SiO_2$ layer is preferably formed by thermal oxidation of the single-crystal silicon layer because the $SiO_2$ layer acts as a polishing stop.

With the method according to the second aspect, the polysilicon layer, which has an electrically resistivity greater than that of the device regions and a thermal conductivity greater than that of an insulator such as $SiO_2$, is formed on the insulating substructure in the non-device region.

Therefore, an improved radiation performance of heat, which is substantially equal to the conventional case of FIG. 3, can be obtained.

Also, the polysilicon layer can be regarded as a dielectric concerning the parasitic capacitance between the substrate and a conductor formed over the non-device region, if the polysilicon layer has a suitable electrical resistivity for the operating frequency range of the semiconductor device. Accordingly, the parasitic capacitance can be lower than the case of FIG. 3 and be approximately as low as the case of FIG. 4.

Since the polysilicon layer is formed in the non-device region, no depression is produced in a polishing process for flattening the tops of the device regions and the non-device region.

Since the resistivity of the polysilicon layer varies dependent upon its doping concentration of an impurity, it can be adjusted by adjusting the doping concentration.

A fabrication method of a semiconductor device according to a third aspect of the present invention includes the following steps:

An SOI structure having an electrically resistive single-crystal silicon layer formed on an insulating substructure is prepared. Then, the resistive single-crystal silicon layer is selectively doped with an impurity to decrease in resistivity, forming impurity-doped regions. Trenches are formed to surround the impurity-doped regions, respectively, defining device regions and a non-device region on the substructure. The trenches are filled with a burying insulator to form sidewall insulators. The device regions are laterally isolated from each other by the sidewall insulators. Electronic elements are formed in the device regions.

With the method according to the third aspect, since the single-crystal silicon layer is formed not only in the device regions but also in the non-device region, an improved radiation performance of heat, which is substantially equal to the conventional case of FIG. 3, can be obtained.

Also, the resistive single-crystal silicon layer can be regarded as a dielectric concerning the parasitic capacitance between the substrate and a conductor formed over the non-device region, if the single-crystal silicon layer has a suitable electrical resistivity for the operating frequency range of the semiconductor device. Accordingly, the parasitic capacitance can be lower than the case of FIG. 3 and be approximately as low as the case of FIG. 4.

Since the electrical resistivity of the resistive single-crystal silicon layer varies dependent upon its doping concentration of an impurity, it can be adjusted by adjusting the doping concentration.

In the methods according to the first to third aspects, preferably, at least one of the sidewall insulators is formed to extend along a conductor electrically connected to the corresponding device region. In this case, since the sidewall insulators are formed to extend along conductors, the parasitic capacitance between the conductors and the substructure can be effectively reduced by the sidewall insulators, and at the same time, the heat radiation performance can be improved due to the single-crystal silicon layer disposed in the non-device region.

The sidewall insulators are preferably wider in plan view than or equal to the corresponding conductors.

DESCRIPTION OF THE PREFERRED EMBODIMENTS

Preferred embodiments of the present invention will be described below while referring to the drawings attached.

FIRST EMBODIMENT

A fabrication method of a bipolar semiconductor device according to a first embodiment is shown in FIGS. 8A to 8F, in which only one device region is drawn for the sake of simplification.

Figure 8A:
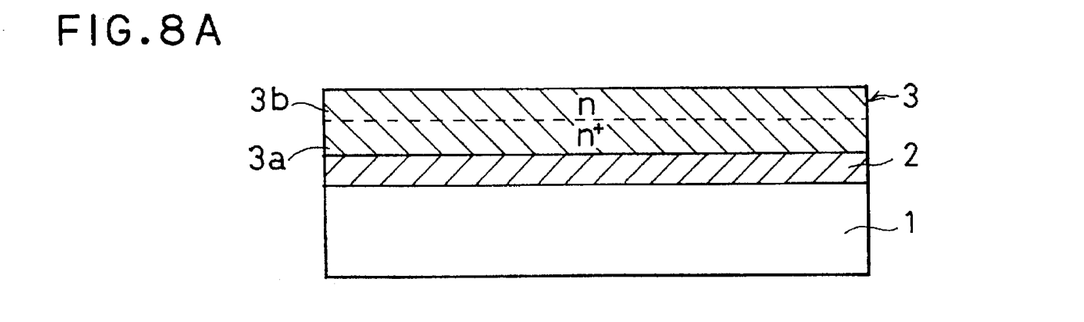
FIGS. 8A to 8F are partial cross-sectional views showing a fabrication method of a semiconductor device according to a first embodiment of the invention, respectively.

First, as shown in FIG. 8A, an SOI structure having a single-crystal Si substrate 1, an $SiO_2$ layer 2 and an n-type single-crystal Si layer 3 is prepared. The single-crystal Si layer 3 is formed on the $SiO_2$ layer 2 and therefore, it can be said that the layer 3 is formed on an insulating substructure.

The SOI structure may be produced by the conventional SIMOX technique, wafer bonding technique or the like.

Here, the Si layer 3 is of a two-layer structure made of an n+-type lower sublayer 3a and an n-type upper sublayer 3b. The lower sublayer 3a is used for buried regions of bipolar transistors. The upper sublayer 3b is an epitaxial layer and is used for collector, base and emitter regions of the transistors. However, it is needless to say that the layer 3 may be of a single layer structure.

The single-crystal Si layer 3 is about 1 to 2 μm in thickness. The $SiO_2$ layer 2 is about 0.3 to 1.0 μm in thickness. The lower sublayer 3a is doped with arsenic (As) at a doping concentration of $10^{20}$ atoms/cm$^3$ and is about 0.001 Ω.cm in resistivity. The upper sublayer 3b is doped with phosphorus (P) at a doping concentration of $10^{16}$ atoms/cm$^3$ and is about 1 Ω.cm in resistivity.

Figure 8B:
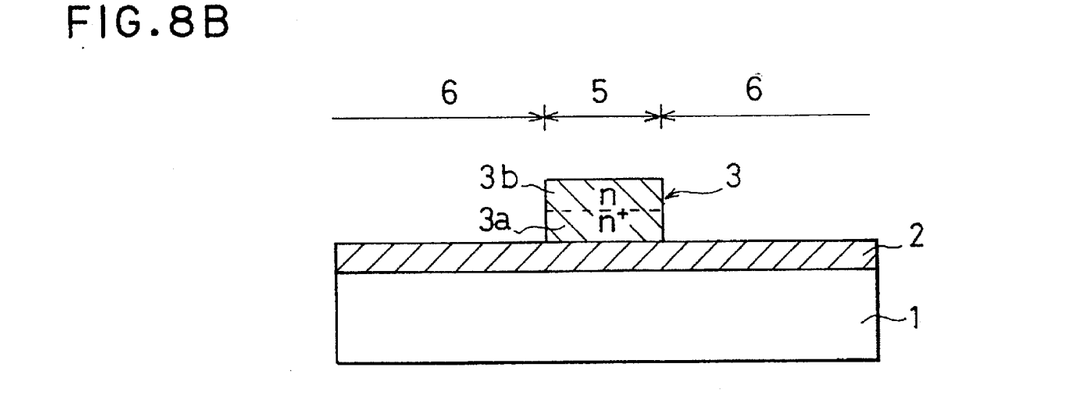

Next, the single-crystal Si layer 3 is selectively removed by the popular photolithography and dry etching techniques to form single-crystal Si islands on the $SiO_2$ layer 2, defining device regions 5 by the islands and a remaining non-device region 6, as shown in FIG. 8B.

Figure 8C:
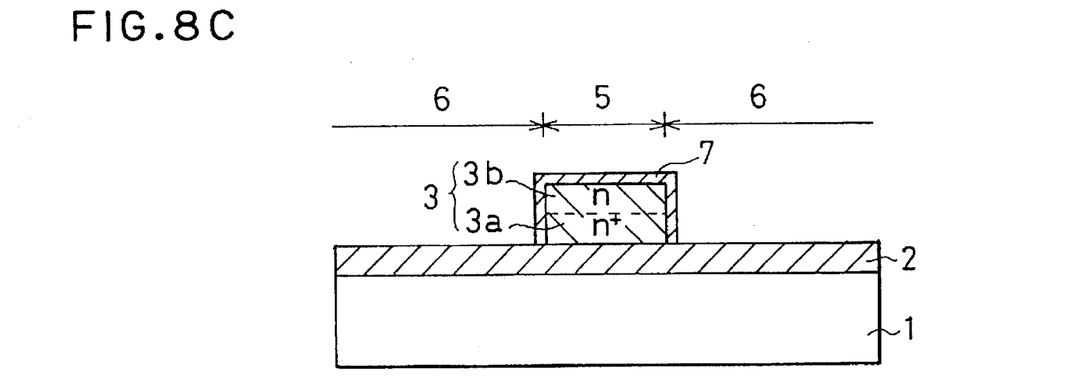

An $SiO_2$ film 7 is formed on the exposed surfaces of the device regions 5 by thermal oxidation. The film 7 covers the exposed top faces and side faces of the device regions 5, as shown in FIG. 8C.

Figure 8D:
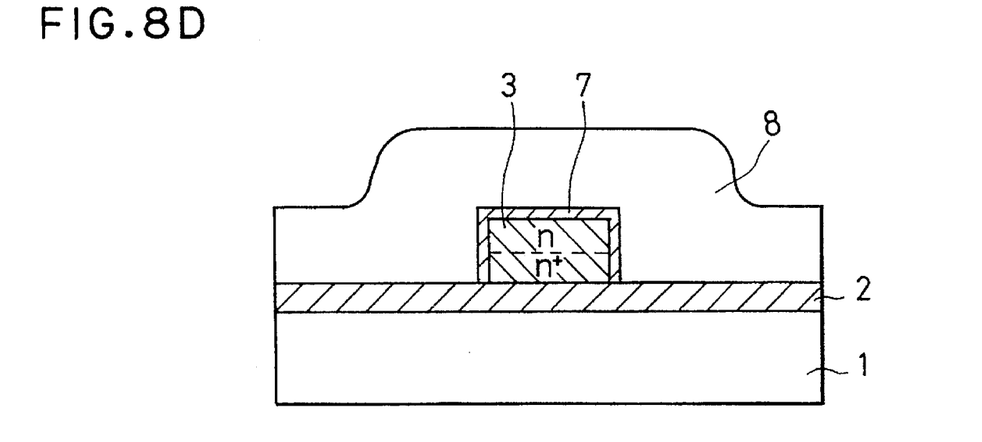

A thick, undoped polysilicon film 8 is deposited by Chemical Vapor Deposition (CVD) using dichlorosilane ($SiH_2Cl_2$) or the like to cover the $SiO_2$ film 7 and the exposed $SiO_2$ layer 2 over the substrate 1, as shown in FIG. 8D.

Figure 8E:
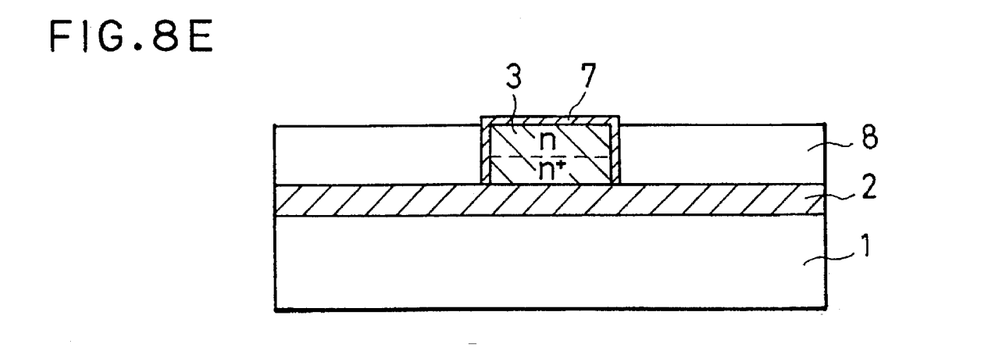

To flatten or planarize the surface of the polysilicon film 8, the film 8 is polished using a slurry until the $SiO_2$ film 7 is exposed at the top faces of the device regions 5, as shown in FIG. 8E. The slurry is, for example, made of an alkaline solution such as a potassium hydroxide (KOH) solution containing silica particles of 20 to 30 nm in diameter.

During this polishing process, the $SiO_2$ film 7 at the top faces of the device regions 5 acts as a polishing stop to ensure the exact end point detection of this process.

Figure 8F:
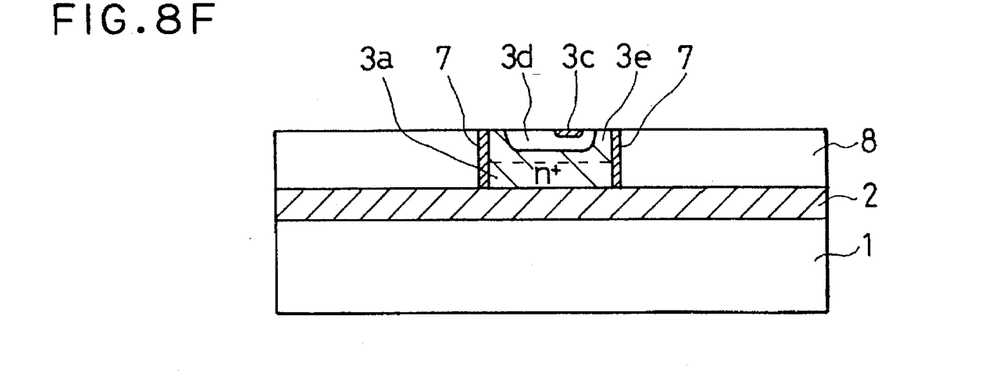

The $SiO_2$ film 7 remaining at the top faces of the device regions 5 is then removed by wet etching using a hydrogen fluoride (HF) solution or the like, as shown in FIG. 8F.

Finally, using the conventional techniques, the collector regions 3e, base regions 3d and emitter regions 3c are formed in the device regions 5, resulting in the semiconductor device as shown in FIG. 8F. Interconnecting conductors (not shown) are then formed over the device regions 5 and the non-device region 6 through an interlayer insulator film (not shown).

With the method according to the first embodiment described above, the remaining polysilicon film 8 covers the non-device region 6. The undoped polysilicon film 8 typically has a large resistivity of 1000 Ω.cm or more. Therefore, the film 8 can be regarded as or equivalent to a dielectric concerning the parasitic capacitances between the substrate 1 and the interconnecting conductors for the operating frequency in the order of MHz or GHz. This means that the parasitic capacitances are kept as approximately low as in the case of FIG. 4.

Silicon has a dielectric constant of 11.0 and $SiO_2$ has a dielectric constant of 3.9. Therefore, the parasitic capacitances are greater than the case of FIG. 5 and less than the case of FIG. 3.

The polysilicon film 8 in the non-device region 6 has a greater thermal conductivity than the $SiO_2$ film 78 in the case of FIG. 5. Therefore, an improved heat radiation performance can be obtained compared with the case of FIG. 5. The heat radiation performance is approximately equal to the cases of FIGS. 2 and 3.

No depression is produced in the non-device region 6 during the polishing process because the device regions 5 and the non-device region 6 are made of the same Si-system material.

Additionally, since the non-device region 6 is covered with the polysilicon film 8, not an $SiO_2$ film, the stresses applied to the substrate 1 are less than the case of FIG. 1.

In the first embodiment, although the polysilicon film 8 is not doped with an impurity, it may be doped with any impurity if the doping concentration is sufficiently low for being regarded as a dielectric.

SECOND EMBODIMENT

A fabrication method of a bipolar semiconductor device according to a second embodiment is shown in FIGS. 9A to 9D, in which only one device region is drawn for the sake of simplification.

Figure 9A:
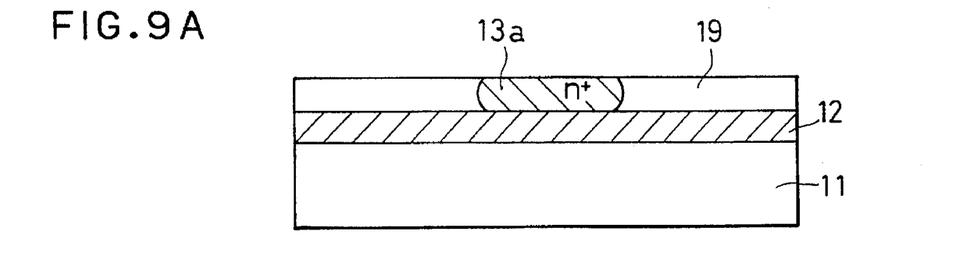
FIGS. 9A to 9D are partial cross-sectional views showing a fabrication method of a semiconductor device according to a second embodiment of the invention, respectively.

First, as shown in FIG. 9A, an SOI structure having a an electrically resistive single-crystal Si substrate 11, an SiO$_2$ layer 12 and an n-type single-crystal Si layer 19 is prepared. The single-crystal Si layer 19 is formed on the SiO$_2$ layer 12 and therefore, it can be said that the layer 19 is formed on an insulating substructure.

Typically, the electrically resistive single-crystal Si layer 19 has an electrical resistivity about 800 to 1000 $\Omega$.cm. The preferable resistivity of 10 $\Omega$.cm or more is sufficient for the embodiment.

The Si layer 19 is about 2 $\mu$m in thickness. The SiO$_2$ layer 2 is about 0.3 to 1.0 $\mu$m in thickness.

The SOI structure may be produced by the conventional wafer bonding technique in which a single-crystal Si bonding wafer having an extremely low doping concentration is bonded to a base Si wafer.

The resistive Si layer 19 is selectively doped with As at a doping concentration of 10$^{20}$ atoms/cm$^3$ to decrease in resistivity to about 0.001 $\Omega$.cm, forming n-type impurity-doped regions 13a at corresponding positions to device regions, as shown in FIG. 9A.

Figure 9B:
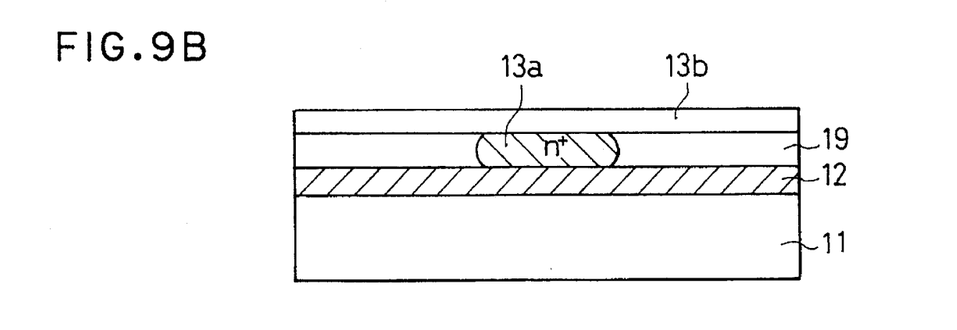

Then, as shown in FIG. 9B, an Si epitaxial layer 13b is formed on the electrically resistive Si layer 19 over the substrate 11. The layer 13b is doped with P at a doping concentration of 10$^{16}$ atoms/cm$^3$ and is about 1 $\Omega$.cm in resistivity.

Figure 9C:
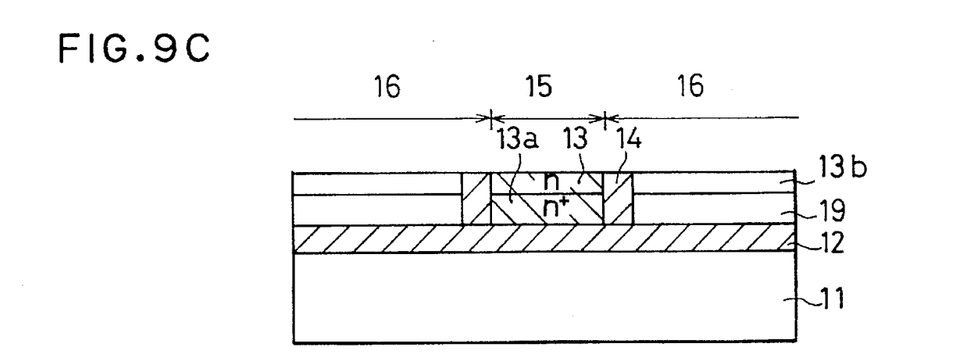

Trenches are formed to surround the respective impurity-doped regions 13a by the conventional techniques, defining device regions 15 and a non-device region 16 on the SiO$_2$ layer 12, as shown in FIG. 9C. The trenches are filled with a burying insulator of SiO$_2$. The buried SiO$_2$ constitutes sidewall insulators 14. Thus, the device regions are laterally isolated from each other by the sidewall insulators 14.

Figure 9D:
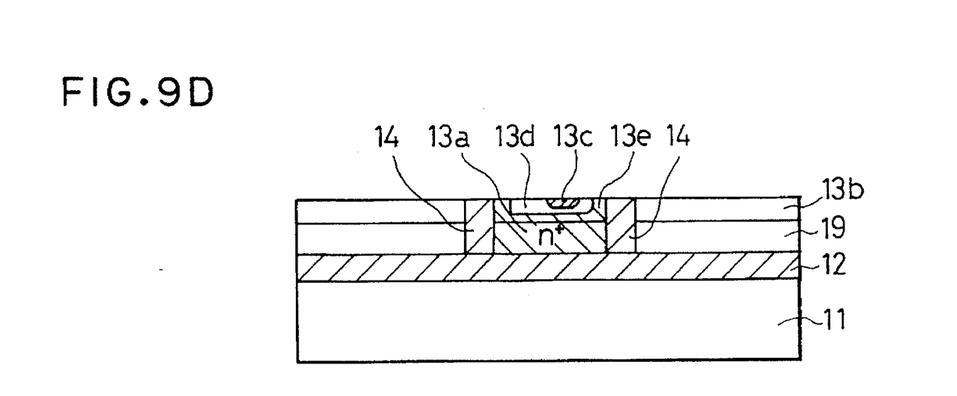

Finally, using the conventional techniques, the collector regions 13e, base regions 13d and emitter regions 13c are formed in the epitaxial layer 13b of the device regions 15, resulting in the semiconductor device as shown in FIG. 9D. Interconnecting conductors (not shown) are then formed over the device regions 15 and the non-device region 16 through an interlayer insulator film (not shown).

With the method according to the second embodiment, since the electrically resistive single-crystal Si layer 19 and the n-type epitaxial layer 14b are placed in the non-device region 16. The layer 19 typically has a large resistivity of 800 to 1000 $\Omega$.cm Therefore, the layer 19 can be regarded as or equivalent to a dielectric concerning the parasitic capacitances between the substrate 11 and the interconnecting conductors for the operating frequency in the order of MHz or GHz. This means that, similar to the first embodiment, the parasitic capacitances are kept as approximately low as in the case of FIG. 4.

Because of the difference in thermal conductivity, an improved radiation performance of heat that is substantially equal to the conventional case of FIG. 3 can be obtained.

No depression is produced in the non-device region 6 because no polishing process is necessary.

Since the electrically non-device region 16 is covered with the resistive Si layer 19 and the n-type Si epitaxial layer 13b, the stresses applied to the substrate 11 are less than the case of FIG. 1.

There is an additional advantage that this method can be performed by using the conventional trench isolation technique.

THIRD EMBODIMENT

Figure 10:
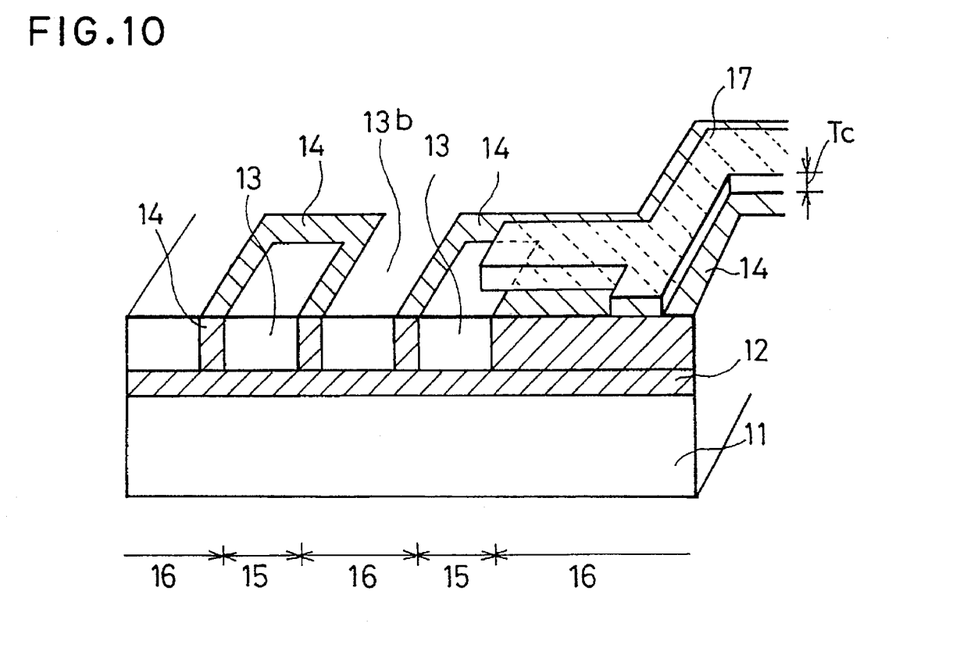
FIG. 10 is a partial perspective view of a semiconductor device fabricated by a method according to a third embodiment of the invention, in which the device is seen through the cross-section along the line X—X in FIG. 11.
Figure 11:
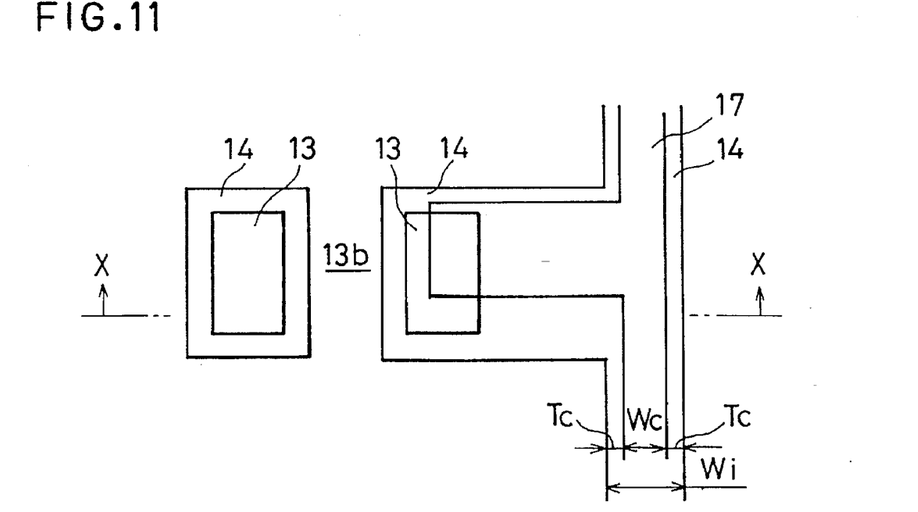
FIG. 11 is a partial plan view of the semiconductor device of FIG. 10 showing a layout the device and non-device regions.

FIGS. 10 and 11 show a semiconductor device fabricated by a method according to a third embodiment. This method is the same as that of the method of the second embodiment excepting that the sidewall insulator 14 the corresponding device region 15 of which is connected to an interconnecting conductor 17 is formed to extend along the conductor 17.

Therefore, there is an advantage that the parasitic capacitance between the conductor 17 and the substrate 11 can be reduced effectively by the insulator 14, in addition to the improved heat radiation performance due to the single-crystal Si layer 13b disposed in the non-device region 16.

As shown in FIGS. 10 and 11, the sidewall insulator 14 disposed below the conductor 17 preferably has the width Wi equal to or greater than the width Wc of the conductor 17 in consideration with the parasitic capacitance due to the side faces of the conductor 17.

More preferably, if the thickness of the conductor 17 is defined as Tc, the width Wi of the sidewall insulator 14 is equal to (Wc+2 Tc) or less.

Although only one conductor level is shown in the third embodiment, it is needless to say that a plurality of interconnecting conductors levels may be provided over the SOI structure. In this case, the conductor 17 is preferably contained in the lowest one of the levels, because it is sufficient for the purpose of the parasitic capacitance reduction.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor device comprising the steps of:
    preparing an SOI structure having a single-crystal silicon layer formed on an insulating substructure;
    selectively removing said single-crystal silicon layer to thereby form island-like device regions and a non-device region on said substructure, said device regions being made of a remaining portion of said single-crystal silicon layer;
    selectively forming an insulator layer to cover respective exposed surfaces of said device regions;
    forming a resistive silicon layer to cover said device regions and said non-device region, said resistive silicon layer having an electrical resistivity greater than that of said device regions;
    planarizing a surface of said resistive silicon layer until said insulator layer is exposed at respective tops of said respective device regions;
    selectively removing said insulator layer from said respective tops of said device regions; and
    forming electronic elements in said device regions;
    wherein said insulator layer remaining after said selective removal step serves as sidewall insulators for said respective device regions.

2. The method as claimed in claim 1, wherein said resistive silicon layer is made of polysilicon.

3. The method as claimed in claim 2, wherein said step of forming said sidewall insulators is performed by oxidizing said device regions to produce an SiO$_2$ film; and selectively removing said SiO$_2$ film at said tops of said device regions.

4. The method as claimed in claim 3, wherein said SiO$_2$ film selective removal step is performed by a polishing process.

5. The method as claimed in claim 1, wherein said resistive silicon layer is made of single-crystal silicon.

6. The method as claimed in claim 5, wherein said step of forming said sidewall insulators is performed by forming trenches that surround said respective device regions; and filling said trenches with a burying insulator.

7. The method as claimed in claim 1, wherein said resistive silicon layer has a resistivity of at least 10 Ω.cm.

8. A fabrication method of a semiconductor device comprising the steps of:

preparing an SOI structure having a single-crystal silicon layer formed on an insulating substructure;

selectively removing said single-crystal silicon layer to form device regions and a non-device region on said insulating substructure, said device regions being made of a remaining portion of said single-crystal silicon layer;

forming an insulator layer to cover exposed top and side faces of said device regions;

forming a polysilicon layer to cover said insulator layer of said device regions and said non-device region, said polysilicon layer having an electrical resistivity greater than that of said device regions;

planarizing a surface of said polysilicon layer by polishing until said insulator layer is exposed from said polysilicon layer at respective tops of said device regions;

selectively removing said insulator layer from said respective tops of said device regions; and forming electronic elements in said device regions;

wherein said insulator layer remaining after said selective removal step serves as sidewall insulators for said respective device regions;

and wherein said device regions are laterally isolated from each other by said sidewall insulators;

and wherein said remaining polysilicon layer is placed on said non-device region.

9. The method as claimed in claim 8, wherein said insulator layer is made of SiO$_2$.

10. The method as claimed in claim 9, wherein said insulator layer of SiO$_2$ is formed by thermal oxidation of said single-crystal Si layer.

11. The method as claimed in claim 8, wherein said insulator layer acts as a polishing stop.

12. The method as claimed in claim 8, wherein said single-crystal Si layer contains a lower sublayer and an upper sublayer, and said lower sublayer acting as a buried layer of a bipolar transistor and said upper sublayer containing collector, base and emitter regions thereof.

13. The method as claimed in claim 8, wherein said resistive silicon layer has a resistivity of at least 10 Ω.cm.

14. A fabrication method of a semiconductor device comprising the steps of:

preparing an SOI structure having a first single-crystal silicon layer formed on an insulating substructure;

selectively doping an impurity into said first single-crystal silicon layer to form impurity-doped regions and undoped regions, said impurity-doped regions having a lower electrical resistivity than that of said undoped regions of said first single-crystal silicon layer;

forming a second single-crystal silicon layer on said first single-crystal silicon layer to cover said impurity-doped regions, said second single-crystal silicon layer having a lower electrical resistivity that of said first single-crystal silicon layer;

forming trenches to laterally surround said respective impurity-doped regions, to define device regions and a non-device region on said substructure, said trenches vertically penetrating said first single-crystal silicon layer and said second single-crystal silicon layer to reach said substructure;

filling said trenches with a burying insulator to form sidewall insulators, said device regions being laterally isolated from each other by said sidewall insulators; and forming electronic elements in said device regions;

wherein said first single-crystal silicon layer and said second single-crystal silicon layer are located on said insulating substructure in said non-device region.

15. The method as claimed in claim 14, wherein said sidewall insulators are made of SiO$_2$.

16. The method as claimed in claim 14, wherein each of said impurity-doped regions acts as a buried layer of a bipolar transistor and said epitaxial layer contains collector, base and emitter regions thereof in said device regions.

17. The method as claimed in claim 14, wherein said resistive silicon layer has a resistivity of at least 10 Ω.cm or greater.

18. The method as claimed in claim 14, wherein at least one of said sidewall insulators is formed to extend along a conductor connected to a corresponding one of said device regions.

19. The method as claimed in claim 18, wherein at least one of said sidewall insulators has a width at least equal to that of said conductor.

* * * * *